Sept. 8, 1970 J. C. ANGUS ET AL 3,527,622

THERMOELECTRIC COMPOSITION AND LEG FORMED OF LEAD, SULFUR, AND TELLURIUM

Filed Oct. 13, 1966 2 Sheets-Sheet 1

INVENTORS
RUSSELL E. FREDRICK
JOHN C. ANGUS
BY
Carpenter, Abbott, Coulter & Kinney
ATTORNEYS INVENTORS
RUSSELL E. FREDRICK
JOHN C. ANGUS
BY Carpenter, Abbott, Coulter & Kinney
ATTORNEYS United States Patent Office 3,527,622
Patented Sept. 8, 1970

3,527,622

THERMOELECTRIC COMPOSITION AND LEG FORMED OF LEAD, SULFUR, AND TELLURIUM

John C. Angus, Shaker Heights, Ohio, and Russell E. Fredrick, White Bear Lake, Minn., assignors to Minnesota Mining & Manufacturing Company, St. Paul, Minn., a corporation of Delaware Continuation-in-part of application Ser. No. 241,108, Nov. 27, 1962. This application Oct. 13, 1966, Ser. No. 604,087
Int. Cl. H01r *1/18*
U.S. Cl. 136—238 4 Claims This application is a continuation-in-part of application, Ser. No. 241,108, filed Nov. 27, 1962, now abandoned, and describes an invention of new thermoelectric compositions and methods for making them.

One measure for the usefulness of a thermoelectric material is the quantity called "figure of merit," represented by Z and defined by the formula $S^2/K\rho$. In this formula, S is the Seebeck coefficient in microvolts/° C., K is the thermal conductivity in watts/cm.-° C., and $\rho$ is the electrical resistivity in microohm-centimeters. The higher the figure of merit the more efficiently the thermoelectric material will convert heat to electricity.

The thermoelectric compositions of this invention have high figures of merit and are efficient thermoelectric converters of heat to electricity. The new compositions are based upon lead telluride, but they also include sulfur, and the new compositions have been found to exhibit a thermal conductivity lower than that for lead telluride. While the inclusion of sulfur in lead telluride also increases electrical resistivity for a given carrier concentration, thereby decreasing the characteristic $S^2/\rho$, which is called the "power number," the reduction in thermal conductivity is significantly larger and as a result figure of merit is significantly increased.

Previous to this invention, it was known, as discussed, for example, in U.S. Pat. 2,896,005 to Fritts et al., column 7, that very small amounts of sulfur in lead telluride did not destroy the usefulness of lead telluride thermoelectric compositions. Using the language of the Fritts patent, it was known that sulfur could be tolerated in lead telluride in amounts in which "sulfur is found as a contaminant in commercially available tellurium." In contrast to this prior teaching, this invention teaches that not only can sulfur be tolerated, but that in certain amounts it provides beneficial changes in lead telluride.

The described superiority in figure of merit is, in general, found with compositions that consist essentially of between about 49.5 and 52 atomic percent lead, between about 2 and 10 atomic percent sulfur, and tellurium. In addition, promoting agents may be included in amounts sufficient to provide a higher Seebeck coefficient.

Figure 1:
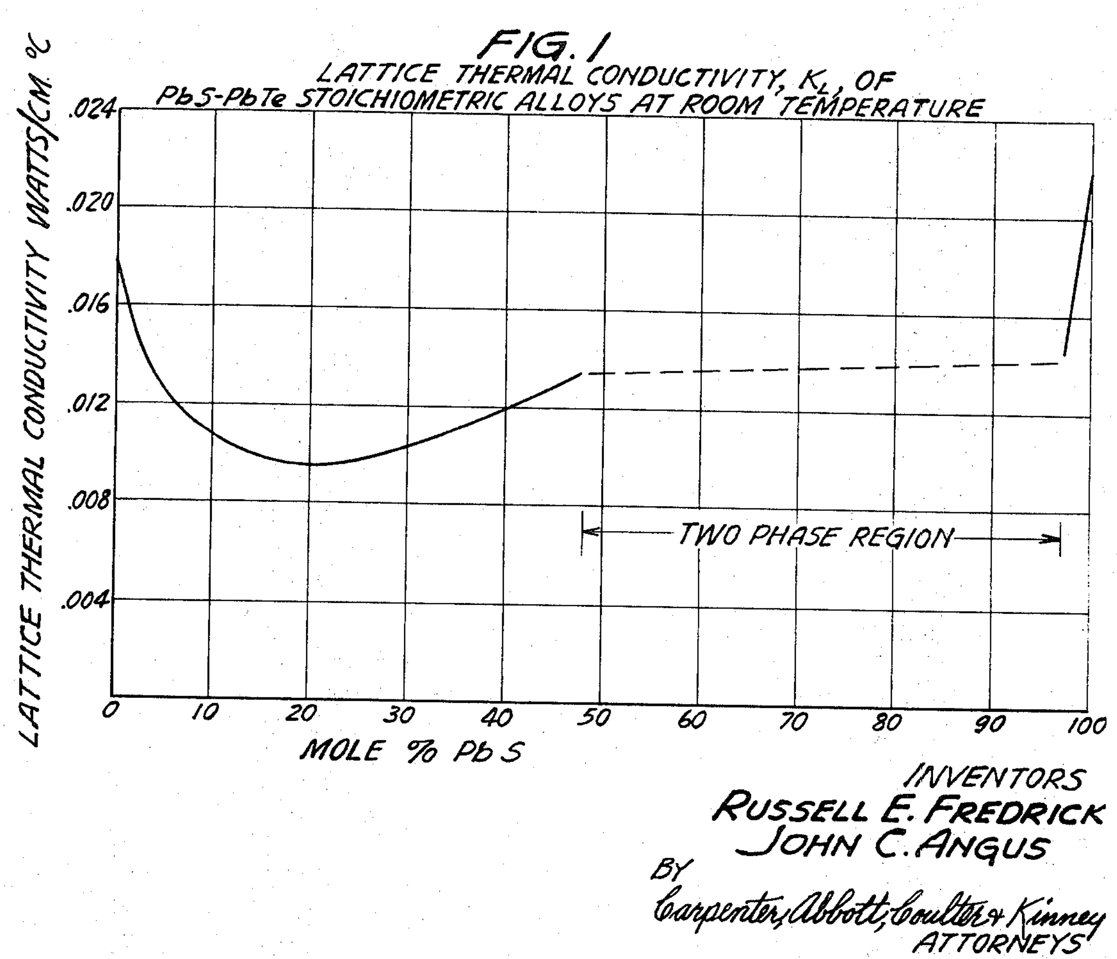
Figure 2:
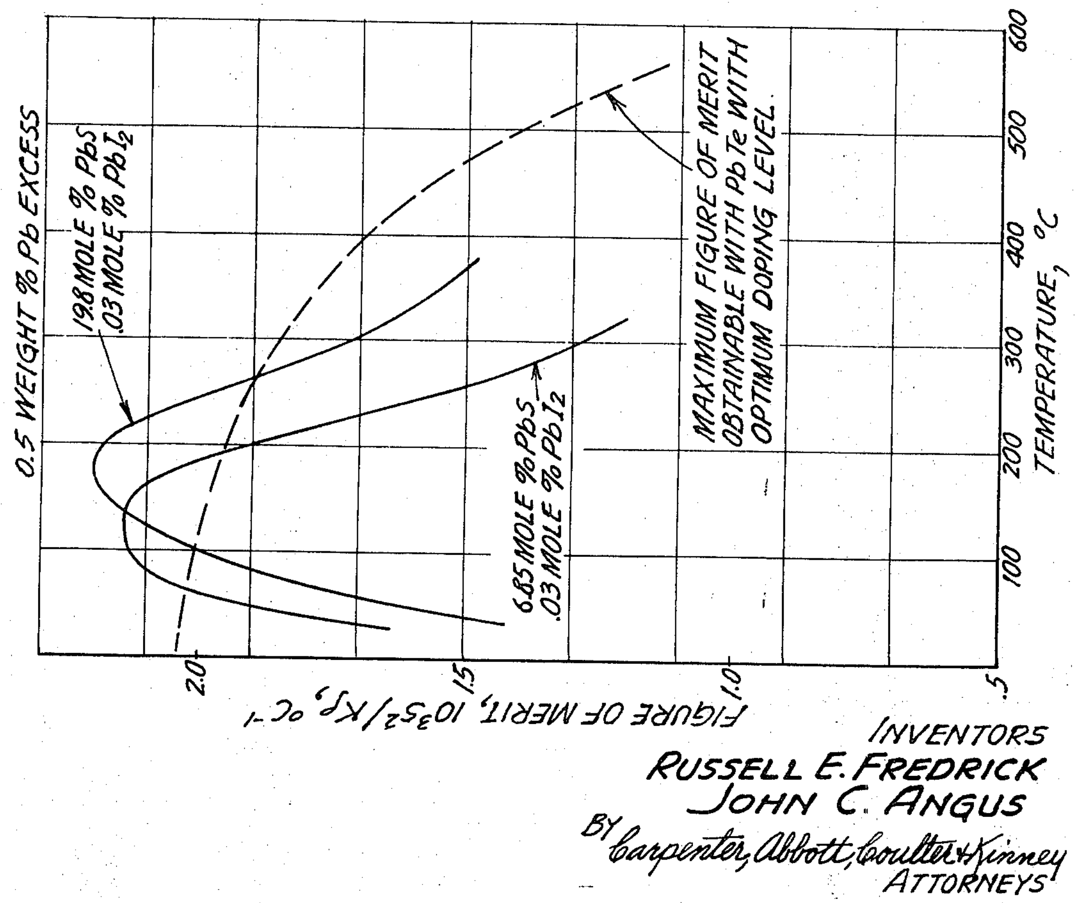

In the drawings, FIG. 1 graphically illustrates the reduction in the lattice component of thermal conductivity that occurs as lead sulfide is added to lead telluride. FIG. 2 graphically compares certain compositions of lead telluride-sulfide with optimally promoted compositions of lead and tellurium.

The graph in FIG. 1 demonstrates that the lattice component of thermal conductivity decreases rapidly with additions of lead sulfide. The power number, though also decreasing with additions of lead sulfide because of an increase in electrical resistivity, decreases much less rapidly. Whereas even small additions of sulfur to lead telluride are believed to produce an improved figure of merit (though this was not realized until this invention), the improvement in figure of merit does not become significant until about 2 atomic percent of sulfur are added. At that point, the reduction in thermal conductivity is enough larger than the reduction in power number that the difference is manifested as a figure of merit significantly larger than that for lead telluride or for lead telluride containing sulfur in a contaminating amount.

FIG. 2 and Table I below present figure of merit information for two lead telluride-sulfide compositions of the invention, one including about 3.4 atomic percent sulfur and the other about 9.9 atomic percent sulfur.

TABLE I.—TEMPERATURE AT WHICH FIGURE OF MERIT MAXIMIZES

| Composition | Temperature °F. | Temperature °C. | Maximum figure of merit °C.$^{-1}$ |
|---|---|---|---|
| PbTe | 230 | 110 | $1.71\times10^{-3}$ |
| 6.85 mol percent PbS | 257 | 125 | $2.14\times10^{-3}$ |
| 19.8 mol percent PbS | 347 | 175 | $2.20\times10^{-3}$ |

The figure of merit of these compositions is compared with the maximum figure of merit exhibited by lead telluride compositions; the figure of merit shown by any point on the dotted curve in FIG. 2 is the best obtainable with lead telluride at the temperature corresponding to that point using the ideal promoting agent in the ideal amount. Though some improvement in figure of merit is believed to occur with even small additions of sulfur, such as in contaminating amounts, the dotted line curve of FIG. 2 or the value for the figure of merit of lead telluride stated in Table I may be taken as representative of lead telluride compositions containing such an amount of sulfur (taken to be no more than about 0.02 weight percent or 0.1 atomic percent of the composition) since the improvement is so slight as to be hardly detectable experimentally.

Both the increase in figure of merit and the higher temperature at which the figure of merit is a maximum are advantageous improvements over lead telluride. At higher temperatures thermoelectric devices operate at greater efficiencies. In addition, manufacture of thermoelectric legs in segments permits matching of compositions with those temperature conditions under which they are most efficient. Accordingly, since the lead telluride-sulfide compositions have different temperatures for maximum figure of merit, they may be used at different points along the thermoelectric leg.

The alloys of this invention of lead, tellurium, and sulfur are N- or P-type depending upon whether there is an excess or deficiency of lead respectively. For those compositions containing lead in excess of the stoichiometric amount, the materials are N-type. For those compositions that have a stoichiometric deficiency of lead, the materials are P-type. Furthermore, these alloys of lead, tellurium, and sulfur may be promoted to either N-type or P-type conductivity by adding known promoting agents. The best N-type thermoelectric properties are exhibited in those compositions which have both an N-type promoter and up to about 2 atomic percent excess metal. Similarly, the best P-type thermoelectric properties are exhibited in those compositions which have both a P-type promoter and up to about 0.5 atom percent lead deficiency.

The principles of promoting N- or P-type conductivity are substantially the same as observed in the individual compounds lead telluride and lead sulfide. For example, N-type conductivity may be promoted by adding a cationic impurity of valence greater than two, such as bismuth or gallium. N-type conductivity may also be promoted by an anionic impurity of valence one, such as chlorine. Preferred promoting agents giving N-type conductivity include bismuth, tantalum, zirconium, titanium, gallium, chlorine, bromine, and iodine. For certain compositions, copper, gold, columbium, uranium, fluorine, antimony, silicon, and indium are effective N-type promoting agents.

P-type conductivity may be promoted by a cationic impurity of valence one, such as sodium. Because of their greater solubility in the host lattice, the preferred P-type promoting agents are sodium and potassium. In addition, thallium and rubidium may be used to promote P-type conductivity.

These lists are not exhaustive, and the selection of promoting agents and promoting levels will be apparent to those skilled in the art. Some promoting agents are quite effective promoting agents in certain compositions, though less effective in others.

Because of the volatility of sulfur at the melting point of alloys of this invention, manufacture of thermoelectric legs of this invention has been found to be best accomplished as follows. The binary compounds lead sulfide and lead telluride and the promoting or doping agent, if used, are weighed out in predetermined proportions with the desired lead excess or deficiency. The compounds are placed in a Vycor glass test tube which is next evacuated and then filled with one atmosphere of hydrogen sulfide. After the compounds are melted and stirred thoroughly by means of an induction heater, the melt is rapidly solidified by immersing the tube in water. The resulting alloy is then crushed to a size of 50-mesh and smaller, thoroughly mixed and cold pressed in steel dies at about 40,000 pounds per square inch. The resulting thermoelectric legs are then sealed in small Vycor glass tubes with a hydrogen atmospheres and annealed. Annealing at 1300° F. for 6 hours has been found to be sufficient to homogenize the alloy. The use of powder pressing techniques enhances the homogeneity of the resulting alloy. Alloys frozen directly from the melt are sometimes non-homogeneous, due to segregation. For example, a lead sulfide rich material may freeze first, leaving a composition richer in lead telluride to freeze later.

The hydrogen sulfide atmosphere employed during the melting operation suppresses the volatilization of the sulfur from the melt. At the melting temperatures of the compounds, the hydrogen sulfide gas dissociates into hydrogen gas and sulfur vapor. The partial pressure of sulfur thus generated tends to keep the sulfur in the melt from vaporizing and to prevent a change in composition during preparation. Sulfur volatilization may also be suppressed by adding a small amount (e.g., approximately 0.2 weight percent) of sulfur to the materials before melting. This added sulfur vaporizes before the other materials melt, forming the desired sulfur vapor.

We claim:

1. A composition having useful thermoelectric properties consisting essentially of between about 49.5 and 52 atomic percent lead, between about 2 and 10 atomic percent sulfur, and tellurium.

2. A composition of claim 1 that includes between about 50 and 52 atomic percent lead and an N-type promoting agent.

3. A composition of claim 1 that includes between about 49.5 and 50 atomic percent lead and a P-type promoting agent.

4. A thermoelectric device including a thermocouple in which at least a portion of one of the thermoelectric legs is formed of a composition of claim 1.

References Cited

UNITED STATES PATENTS

| | | | |
|---|---|---|---|
| 2,811,570 | 10/1957 | Kaiser | 136—238 |
| 2,811,721 | 10/1957 | Fritts et al. | 136—238 X |
| 2,896,005 | 7/1959 | Fritts et al. | 136—238 X |

OTHER REFERENCES

Scanlon, W. W.: P&S . . . in Semiconductors . . . , In Physical Review, vol. 92, No. 6, December 1953, pp. 1573–1575.

Hanzer, M. et al.: Constitution of Binary Alloys, McGraw-Hill, 1958, 2nd edition, TA 490H 279E, pp. 1110–1112.

ALLAN B. CURTIS, Primary Examiner

U.S. Cl. X.R.

252—62.3